United States Patent
Zhao et al.

(10) Patent No.: US 11,430,643 B2
(45) Date of Patent: Aug. 30, 2022

(54) QUANTIFICATION OF PROCESSING CHAMBER SPECIES BY ELECTRON ENERGY SWEEP

(71) Applicant: Tokyo Electron Limited, Tokyo (JP)

(72) Inventors: Jianping Zhao, Austin, TX (US); Peter Ventzek, Austin, TX (US); Charles Schlechte, Austin, TX (US); Michael Hummel, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/037,032

(22) Filed: Sep. 29, 2020

(65) Prior Publication Data

US 2022/0102123 A1 Mar. 31, 2022

(51) Int. Cl.
*H01J 49/00* (2006.01)
*H01J 37/32* (2006.01)
*H01J 49/06* (2006.01)
*H01J 49/42* (2006.01)
*H01J 49/24* (2006.01)

(52) U.S. Cl.
CPC .... *H01J 37/32981* (2013.01); *H01J 49/0031* (2013.01); *H01J 49/06* (2013.01); *H01J 49/24* (2013.01); *H01J 49/421* (2013.01)

(58) Field of Classification Search
CPC ........... H01J 37/32981; H01J 37/32972; H01J 49/0031; H01J 49/06; H01J 49/24; H01J 49/421; H01J 49/147
See application file for complete search history.

(56) References Cited

U.S. PATENT DOCUMENTS

| | | | |
|---|---|---|---|
| 7,462,821 B2* | 12/2008 | Barket, Jr. | H01J 49/0031 250/281 |
| 9,997,325 B2* | 6/2018 | Hosch | H01J 37/32935 |
| 11,201,043 B2* | 12/2021 | Green | H01J 49/0031 |

(Continued)

FOREIGN PATENT DOCUMENTS

| | | |
|---|---|---|
| EP | 0942453 A2 | 9/1999 |
| JP | H09210965 A | 8/1997 |
| JP | 2013045730 A | 3/2013 |

OTHER PUBLICATIONS

PCT International Search Report and Written Opinion, PCT Application No. PCT/US2021/043736, dated Nov. 25, 2021, 10 pages.

*Primary Examiner* — Wyatt A Stoffa
(74) *Attorney, Agent, or Firm* — Slater Matsil, LLP (57) ABSTRACT

A plasma processing system includes a plasma chamber configured to contain a plasma, a shutter chamber fluidically coupled to the plasma chamber via a first orifice, a mass spectrometer fluidically coupled to the shutter chamber, and a shutter disposed in the shutter chamber between the first orifice and the mass spectrometer in the path of a particle beam. The first orifice is configured to generate the particle beam from the plasma using a pressure differential between the shutter chamber and the plasma chamber. The mass spectrometer includes an ionizer configured to ionize species of the particle beam by sweeping through a range of electron energies in a plurality of energy steps. The shutter is configured to open and close during each of the plurality of energy steps.

20 Claims, 7 Drawing Sheets

(56) References Cited

U.S. PATENT DOCUMENTS

| | | | |
|---|---|---|---|
| 2005/0178975 A1* | 8/2005 | Glukhoy | H01J 49/0022 |
| | | | 250/288 |
| 2009/0095902 A1 | 4/2009 | Robinson et al. | |
| 2010/0032587 A1* | 2/2010 | Hosch | H01J 37/32972 |
| | | | 250/493.1 |
| 2013/0048851 A1 | 2/2013 | Kumano et al. | |
| 2015/0270111 A1 | 9/2015 | Wood | |
| 2018/0277348 A1* | 9/2018 | Prest | H01J 49/0031 |
| 2021/0125816 A1* | 4/2021 | Green | G01N 30/7233 |
| 2021/0233760 A1* | 7/2021 | Artaev | H01J 49/107 |

\* cited by examiner

QUANTIFICATION OF PROCESSING CHAMBER SPECIES BY ELECTRON ENERGY SWEEP

TECHNICAL FIELD

The present invention relates generally to measuring quantities of processing chamber species, and, in particular embodiments, to systems and methods for quantifying species present in a processing chamber by sweeping the energy of electrons generated by an ionizer.

BACKGROUND

Diagnostic information during semiconductor processes such as plasma processes is important for process and equipment development. During semiconductor processes, various species may be generated within the processing chamber. For example, during a plasma process, a wide variety of ions, neutral radicals, and metastable species are generated from possible cracking patterns of gases within a plasma chamber. Accurate quantification of the many present species is useful for determining optimal processing parameters and improving equipment design.

A mass spectrometer device may be included in a semiconductor processing system (e.g. a plasma processing system) in order to quantify species in a processing chamber. In some cases, a mass spectrometer may be attached to a plasma chamber, for example. In many applications, however, limitations exist due to high cost and large footprint of accurate mass spectrometer equipment. Additionally, process range for measurement may be limited and data collection may be slow and complicated. Therefore, processing systems that include a low cost, small footprint mass spectrometer that automatically and accurately quantifies and identifies various species in a processing chamber may be desirable.

SUMMARY

In accordance with an embodiment of the invention, a plasma processing system includes a plasma chamber configured to contain a plasma, a shutter chamber fluidically coupled to the plasma chamber via a first orifice, a mass spectrometer fluidically coupled to the shutter chamber, and a shutter disposed in the shutter chamber between the first orifice and the mass spectrometer in the path of a particle beam. The first orifice is configured to generate the particle beam from the plasma using a pressure differential between the shutter chamber and the plasma chamber. The mass spectrometer includes an ionizer configured to ionize species of the particle beam by sweeping through a range of electron energies in a plurality of energy steps. The shutter is configured to open and close during each of the plurality of energy steps.

In accordance with another embodiment of the invention, a method of measuring quantities of species in a processing chamber includes closing a shutter positioned between the processing chamber and a mass spectrometer to block a particle beam originating from the processing chamber. The mass spectrometer includes an ionizer. The method further includes setting an electron energy of the ionizer to an initial energy value and sweeping the electron energy from the initial energy value to a final energy value by cyclically performing the following steps: collecting background quantification data while the shutter is closed, opening the shutter, collecting signal quantification data of species in the particle beam while the shutter is open, closing the shutter, and setting the electron energy to a next value. The method also includes, after collecting signal quantification data with the electron energy set at the final energy value, determining quantities of species in the processing chamber using the signal quantification data and the background quantification data.

In accordance with still another embodiment of the invention, a method of measuring quantities of a species present in a processing chamber includes sweeping an electron energy of an ionizer of a mass spectrometer through a plurality of energy steps beginning at an initial energy value and ending with a final energy value, generating a data set by collecting a series of data points corresponding to detection events of the species at each of the plurality of energy steps; and determining the quantity of a first variety of the species present in the processing chamber using a first interval of the data set beginning at a threshold ionization energy of the first variety. The species includes a mass/charge ratio selected by the mass spectrometer and the first variety also has the mass/charge ratio.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Processing systems that conventionally employ mass spectrometers are subject to various drawbacks and tradeoffs when used for chemistry diagnostics (e.g. density, species identification, quantification information) during semiconductor processes and/or plasma processes. For example, conventional implementations connecting a mass spectrometer to a processing chamber may be prohibitively expensive and/or large. Further, the process range for measurement may be undesirably small. Density and species quantification/identification measurements may not be quantitatively accurate and many species may be misidentified or not detected at all.

Additionally, the data collection of conventional implementations may be overly slow or complicated. An expert engineer may be required to decipher and analyze the collected data resulting in additional expenditure of personnel and time resources. In order to obtain a high signal-to-noise ratio, conventional employed mass spectrometers utilize an ionizer at a set electron energy well above the ionization energy and dissociation energy (e.g. 70 eV) resulting in a combined detection signal of all possible species of a particular mass from all possible sources. Disadvantageously, the constituent individual detection signals representing the different species/sources cannot be separated and evaluated.

In various embodiments, a processing system includes a processing chamber configured to contain various species. For example, the processing chamber may be a plasma chamber configured to contain plasma generated from one or more gaseous substances in the plasma chamber. The processing system also includes a mass spectrometer fluidically coupled to the processing chamber via a beam-forming phase. The beam-forming phase includes a vacuum chamber fluidically coupled to the processing chamber via an orifice configured to generate a particle beam originating from the processing chamber using a pressure differential between the vacuum chamber and the plasma chamber.

The mass spectrometer includes an ionizer configured to ionize species of the particle beam by sweeping through a range of electron energies in a plurality of energy steps. In one embodiment, the mass spectrometer is a residual gas analyzer (RGA) mass spectrometer. A shutter is disposed in the vacuum chamber between the orifice and the mass spectrometer in the path of the particle beam. The shutter is configured to open and close during each of the plurality of energy steps. In one embodiment, the shutter is configured to be rotated by an electrical motor mechanically coupled to the shutter.

In various embodiments, the beam-forming phase includes a plurality of vacuum chambers that includes the vacuum chamber with the shutter (which may be referred to herein as a shutter chamber). For example the beam-forming phase may include cascaded vacuum chambers, each fluidically coupled to a corresponding vacuum pump. The additional vacuum chambers in the beam-forming phase may each be positioned between the processing chamber and the mass spectrometer before or after the shutter chamber.

The systems and processes described herein may advantageously overcome various shortcomings of conventional systems and processes. For example, the embodiment processing systems may advantageously facilitate monitoring of process species, reaction products, process drift, and chamber health during semiconductor processes such as plasma processes (e.g. plasma etching and plasma deposition processes) and thermal processes.

The embodiment processing systems may have the benefit of having a smaller footprint than processing systems that conventionally employ a mass spectrometer. Additionally, the embodiment processing systems may be advantageously less expensive than conventional implementations. The smaller footprint may carry the added advantage of reducing pumping volume requirements further reducing footprint and cost.

Other potential advantages of the embodiment processes herein described are increased data collection speed and reduced analytical complexity. For example, the processing systems may be configured to automatically acquire quantification data and compensate for baseline and/or background effects. Accuracy may also be advantageously improved due to real-time background compensation which can lessen the impact of transient effects such as process drift.

Further, the embodiment processes may advantageously detect more species varieties with improved accuracy. For example, identical species from different sources (e.g. ionized neutrals from the plasma, dissociated neutrals from the plasma, background species) may be distinguishable from one another. Additionally, metastable species (e.g. excited states of stable species) may also be detected and quantified.

Figure 1:
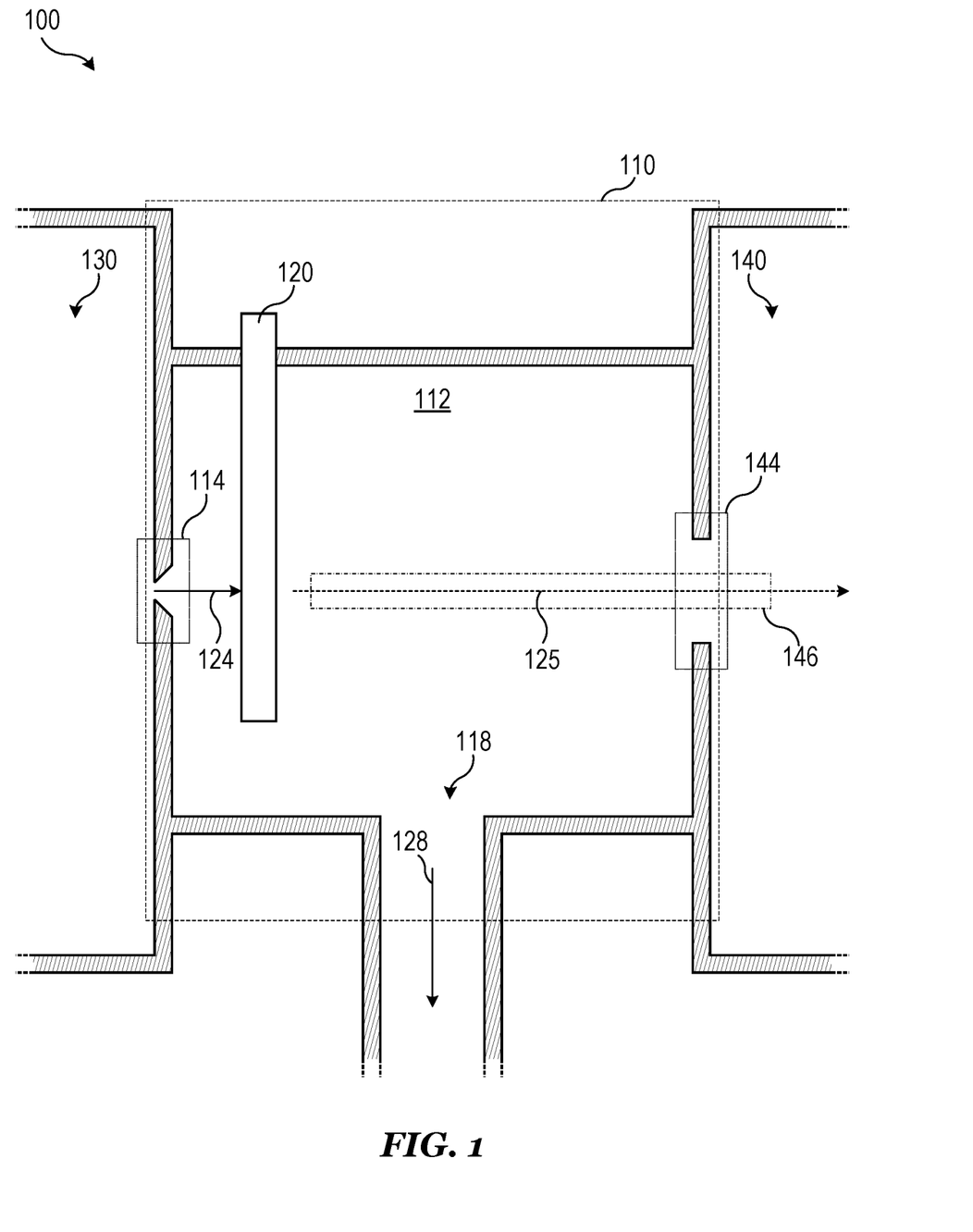
FIG. 1 illustrates a schematic cross-sectional view of an example processing system including a mass spectrometer coupled to a processing chamber via a beam-forming phase in accordance with an embodiment of the invention.
Figure 7:
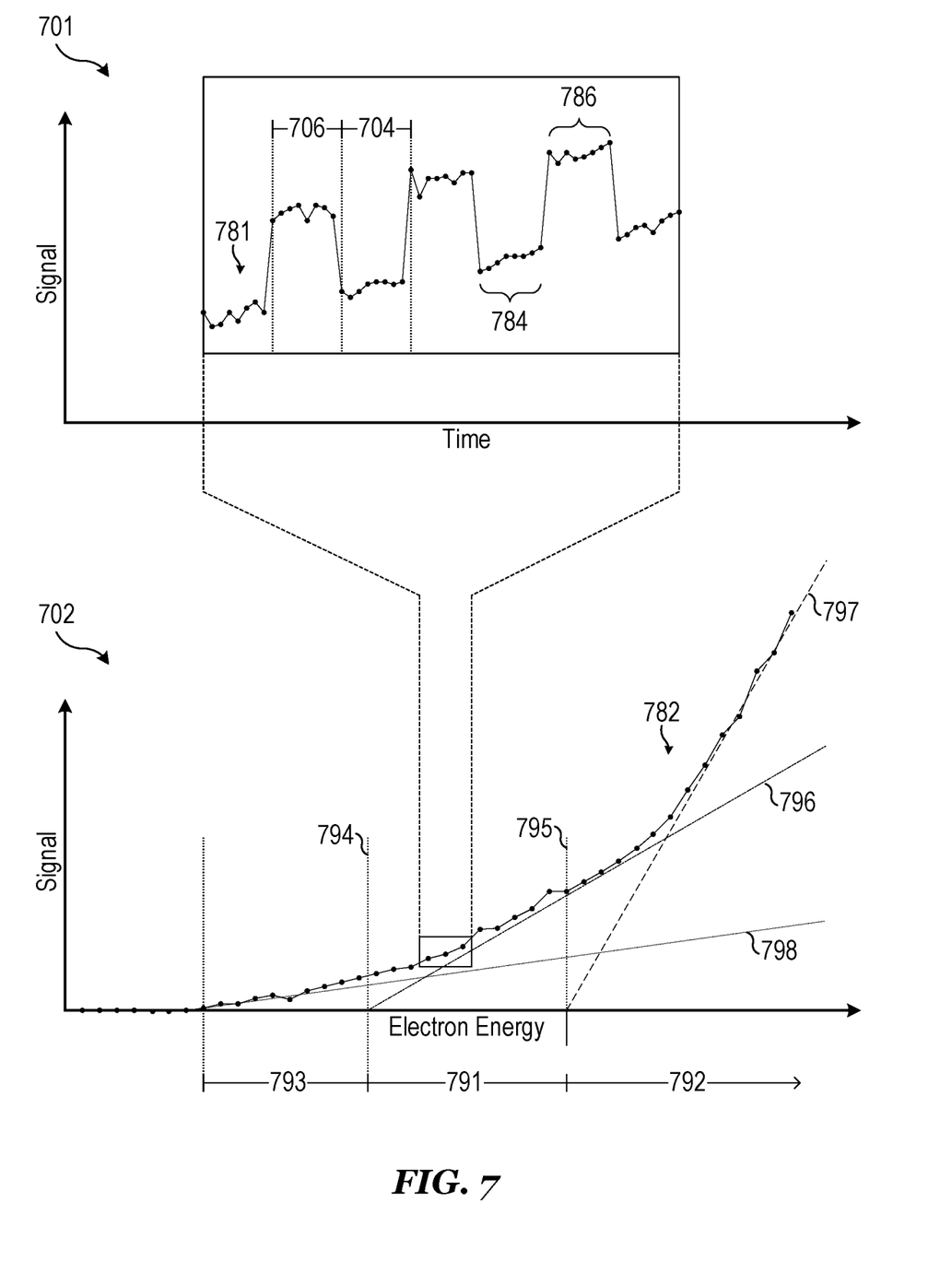
FIG. 7 illustrates two graphs qualitatively demonstrating an example method of measuring quantities of species in a processing chamber by collecting quantification data from a processing chamber using a shutter and an electron energy sweep in accordance with an embodiment of the invention.
Figure 8:
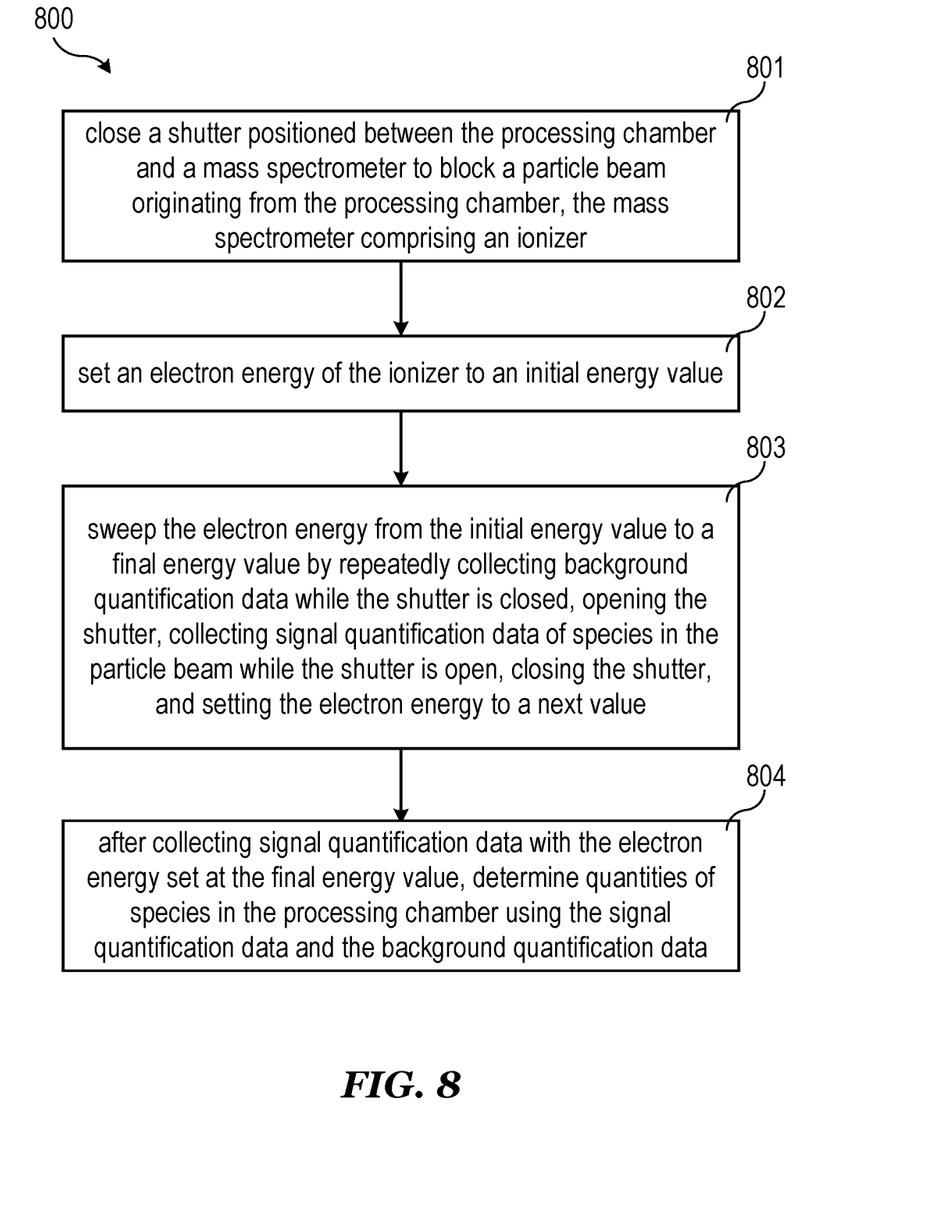
FIG. 8 illustrates an example method of measuring quantities of species present in a processing chamber using collected quantification data in accordance with an embodiment of the invention.
Figure 9:
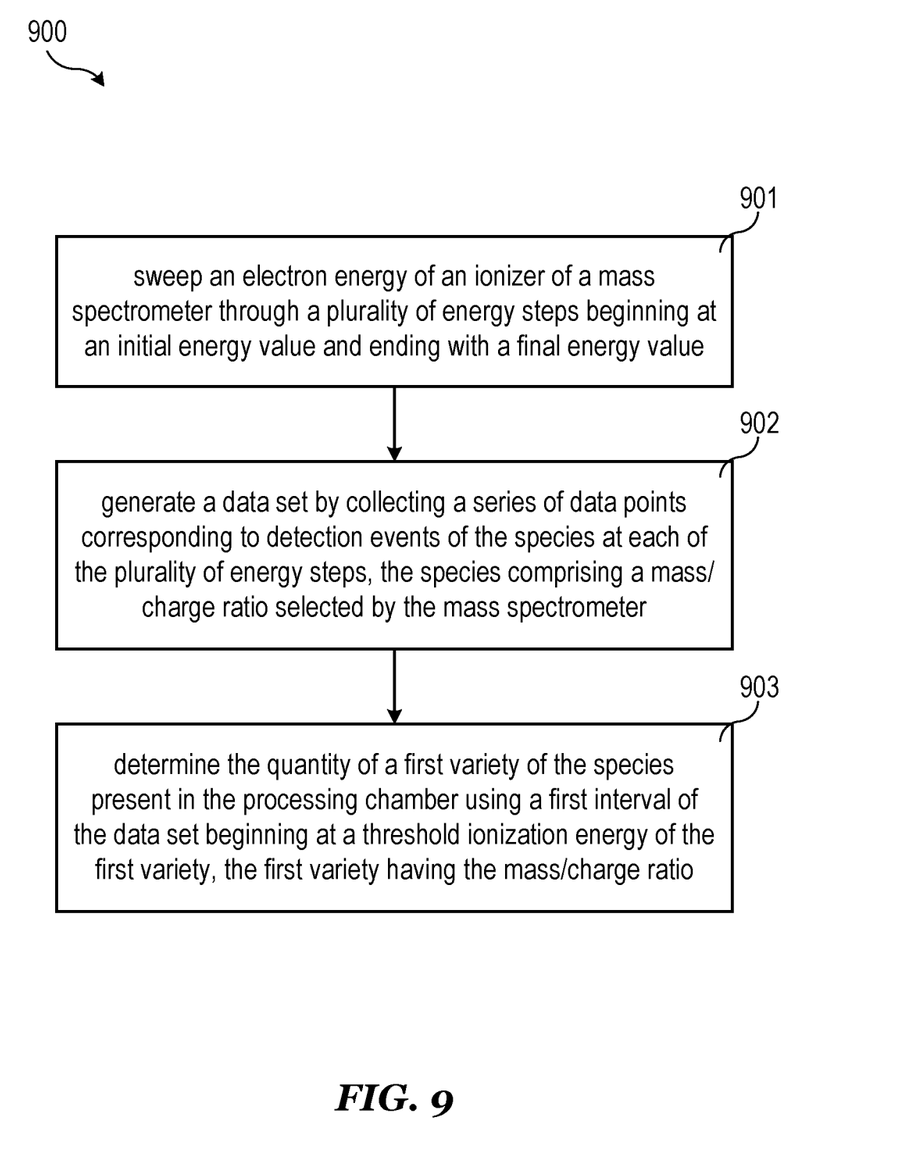
FIG. 9 illustrates an example method measuring quantities of species present in a processing chamber using an electron energy sweep in accordance with an embodiment of the invention.

Embodiments provided below describe various systems and methods for measuring quantities of processing chamber species, and in particular embodiments, systems and methods that include sweeping the energy of electrons generated by an ionizer. The following description describes the embodiments. FIG. 1 is used to describe an embodiment processing system including a mass spectrometer, coupled to a processing chamber via a beam-forming phase. Three more embodiment processing systems are described using FIGS. 2-4. Another embodiment processing system is described using a schematic layout in FIG. 5. An embodiment method of collecting quantification data is described using FIG. 6. FIGS. 7-9 are used to describe three embodiment methods of measuring quantities of species present in a processing chamber.

FIG. 1 illustrates a schematic cross-sectional view of an example processing system including a mass spectrometer coupled to a processing chamber via a beam-forming phase in accordance with an embodiment of the invention.

Referring to FIG. 1, a processing system 100 includes a processing chamber 130 fluidically coupled to a mass spectrometer 140 via a beam-forming phase 110. The beam-forming phase 110 includes a vacuum chamber 112, a shutter 120 in the vacuum chamber 112 and in the path 124 of a particle beam originating from the processing chamber 130. The particle beam is generated by an orifice 114 using a pressure differential between the vacuum chamber 112 and the processing chamber 130. The orifice 114 facilitates fluid communication between the processing chamber 130 and the vacuum chamber 112. For example, particles (e.g. in the gas phase, or in the plasma phase) may pass from the processing chamber 130 through the orifice 114 and into the vacuum chamber 112 as a particle beam (e.g. molecular beam comprising ions, neutrals, etc.).

The pressure in the vacuum chamber 112 is maintained at a lower pressure than the processing chamber 130 (which may also be under vacuum) using an outward particle flow 128 at an exhaust port 118. For example, the outward particle flow 128 may be generated by a vacuum pump coupled to the exhaust port 118. The mass spectrometer 140 is fluidically coupled to the beam-forming phase 110 at an interface 144. In one embodiment, the mass spectrometer 140 is directly coupled to the vacuum chamber 112 at the interface 144. Alternatively, the beam-forming phase 110 may include additional chambers before or after the vacuum chamber 112 along the path of the particle beam.

The shutter 120 is configured to block the path 124 of the particle beam when the shutter 120 is in a closed position. That is, when the shutter 120 is closed, the particle beam is prevented from reaching the mass spectrometer 140. Particles from the beam may impact the shutter 120 and be pumped out through the exhaust port 118 when the shutter 120 is closed. In this way, the mass spectrometer 140 may measure a background data when the shutter 120 is in the closed position. By contrast, the shutter 120 is configured to allow the particle beam to reach the mass spectrometer 140 along the path 125 when the shutter 120 is in an open position. It follows then that when the shutter 120 is open, the mass spectrometer 140 may measure signal data (which includes both the signal from the particle beam and the background).

The processing chamber 130 may be any suitable processing chamber. For example, the processing chamber 130 may be semiconductor processing chamber. In various embodiments, the processing chamber 130 is a plasma chamber is a plasma etching chamber in some embodiments and is a plasma deposition chamber in some embodiments. The processing chamber 130 may also be a thermal processing chamber in some embodiments. In one embodiment, the processing system 100 is a plasma-enhanced atomic layer deposition (PE-ALD) system. In another embodiment, the processing system 100 is a plasma-enhanced atomic layer etching (PE-ALE) system. In yet another embodiment, the processing system 100 is a thermal processing system. In many cases the processing system 100 is a multipurpose processing system capable of executing a variety of processes.

For example, the processing chamber 130 may be any suitable processing chamber where semiconductor processing occurs. It may be desirable in a variety of semiconductor processes to monitor chemical species within the processing chamber 130. Accordingly, the processing system 100 may include, in addition to or instead of the specific examples mentioned above, lithography bake modules, gas etch/cleaning/stripping modules, and others. In some applications, the processing chamber 130 may be generalized to be other parts of a processing system, such as a gas supply line, vacuum line (e.g. chemical analysis in downstream vacuum lines to glean information about upstream processes), exhaust line, as well as other locations where quantifying the chemistry of a gas phase to characterize a process may be desirable.

The mass spectrometer 140 may be any suitable type of mass spectrometer that includes an ionizer 146 (e.g. a filament). In one embodiment, the mass spectrometer 140 is an RGA mass spectrometer. In some embodiments, the ionizer 146 of the mass spectrometer 140 may extend through the interface 144 (as shown). For example, the ionizer 146 may be included in a chamber fluidically coupled to the mass spectrometer 140 along the path 124 of the particle beam (e.g. the vacuum chamber 112 as illustrated). Alternatively, the ionizer may also be contained within the mass spectrometer 140.

In addition to an ionizer, the RGA mass spectrometer may include a mass filter (e.g. an electromagnetic filter such as a quadrupole filter) that only allows a narrow range of masses to pass through at a given time. Since the operational mechanism of the mass filter may be electromagnetic, the ability of particles to pass through the mass filter may also depend on charge. For example, the mass filter of the mass spectrometer 140 may only allow particles having a substantially similar mass/charge ratio (m/z) to pass through and reach the detector.

The mass spectrometer 140 may require a sufficiently low pressure to operate. For example, the pressure in the mass spectrometer 140 may be less than about $7.5 \times 10^{-6}$ Torr. The beam-forming phase 110 may advantageously facilitate an appropriate pressure differential between the processing chamber 130 and the mass spectrometer 140 in order to allow the mass spectrometer to operate and also in order to form the particle beam.

Various species may be detected at by the mass spectrometer 140. In various embodiments, neutral species originating from the processing chamber 130 are detected by the mass spectrometer 140. However, ions may also be detected by the mass spectrometer 140.

Figure 2:
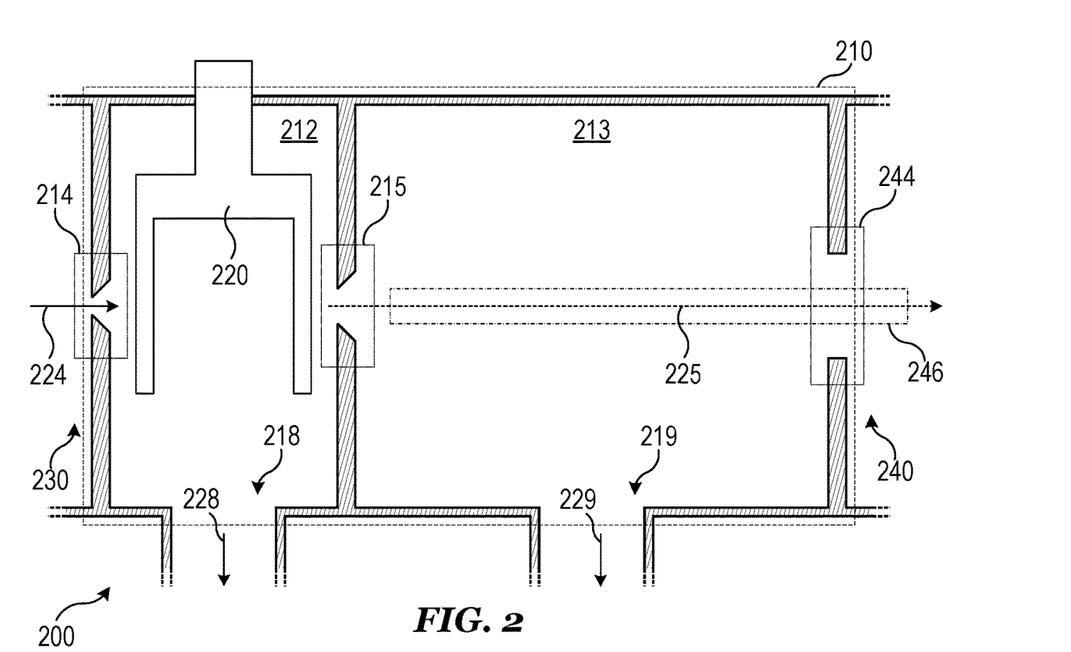
FIG. 2 illustrates a schematic cross-sectional view of an example processing system including a mass spectrometer coupled to a processing chamber via a beam-forming phase that includes a shutter chamber and a quiescence chamber in accordance with an embodiment of the invention.

FIG. 2 illustrates a schematic cross-sectional view of an example processing system including a mass spectrometer coupled to a processing chamber via a beam-forming phase that includes a shutter chamber and a quiescence chamber in accordance with an embodiment of the invention. The processing system of FIG. 2 may be a specific implementation of other processing systems described herein such as the processing system of FIG. 1, for example. Similarly labeled elements may be as previously described.

Referring to FIG. 2, a processing system 200 includes a processing chamber 230 fluidically coupled to a mass spectrometer 240 via a beam-forming phase 210. It should be noted that here and in the following a convention has been adopted for brevity and clarity wherein elements adhering to the pattern "_10" may be related implementations of a beam-forming phase in various embodiments. For example, the beam-forming phase 210 may be similar to the beam-forming phase 110 except as otherwise stated. An analogous convention has also been adopted for other elements as made clear by the use of similar terms in conjunction with the aforementioned three-digit numbering system.

The beam-forming phase 210 is fluidically coupled to the processing chamber 230 via a first orifice 214 enabling a particle beam to enter a shutter chamber 212 of the beam-forming phase 210. A shutter 220 is included in the shutter chamber 212 and serves to block the path 224 of particle beam in the closed position and to permit the particle beam to reach an interface 244 (as well as an ionizer 246) of the mass spectrometer 240 along the path 225 in the open position. In one embodiment, the shutter 220 is a double-side shutter as illustrated. The double-sided shutter may advantageously facilitate fast switching and reduce background disturbance. The shutter chamber 212 is evacuated using a first outward particle flow 228 generated at a first exhaust port 218.

The beam-forming phase 210 further includes a quiescence chamber 213 fluidically coupled to the shutter chamber 212 via second orifice 215. In various embodiments, the diameter of the second orifice 215 is greater than the diameter of the first orifice 214 and is about double the size of the diameter of the first orifice 214 in one embodiment. For example, the diameter of the first orifice 214 may be about 20/1000 ths of an inch (~0.5 mm) while the diameter of the second orifice 215 may be about 35/1000 ths of an inch (~0.9 mm).

The quiescence chamber 213 may be configured to reduce disruption of measurements at the mass spectrometer 240 caused by operation of the shutter 220. In various embodiments, the ionizer 246 of the mass spectrometer 240 extends through the interface 244 and, in one embodiment, is disposed in the quiescence chamber 213. The distance between the ionizer 246 and the second orifice 215 may be small. For example, the small distance between the ionizer 246 and the second orifice 215 may advantageously facilitate a narrow particle beam (e.g. reducing the spread of the beam along the path 225).

Additionally or alternatively, the quiescence chamber 213 may serve to further enhance the signal-to-noise ratio at the mass spectrometer 240. The quiescence chamber 213 is evacuated using a second outward particle flow 229 generated at a second exhaust port 219. The separate evacuation of the quiescence chamber 213 causes the pressure in the quiescence chamber 213 to be lower than the pressure in the shutter chamber 212. Consequently, the signal-to-noise ratio may be advantageously improved at the mass spectrometer 240.

Figure 3:
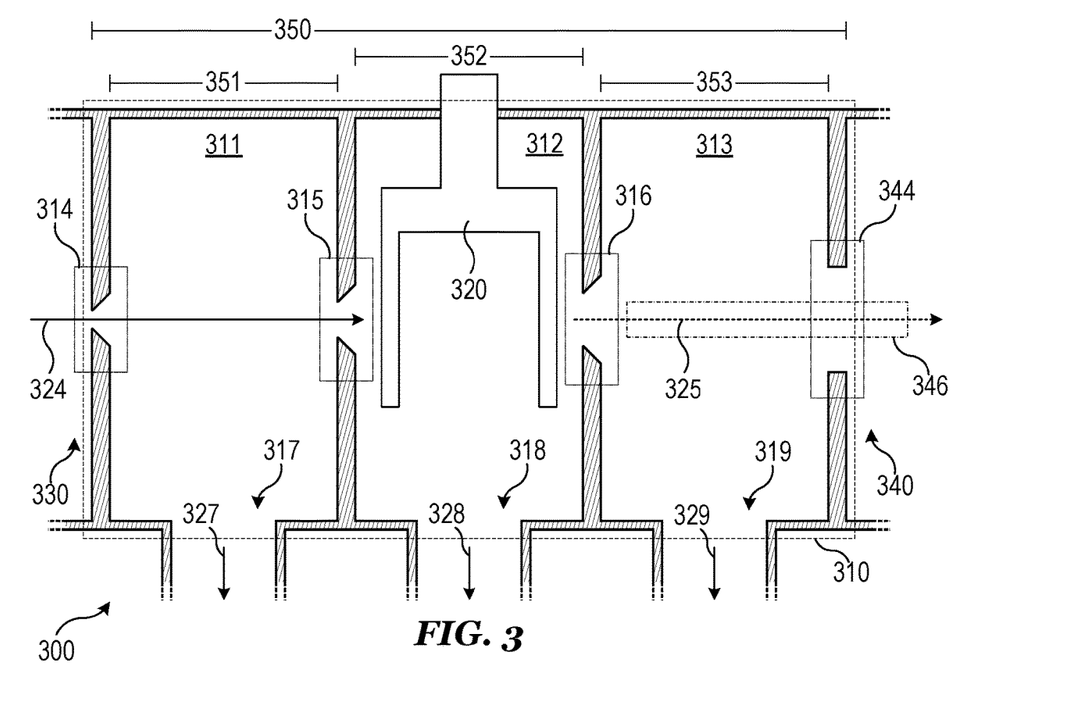
FIG. 3 illustrates a schematic cross-sectional view of an example processing system including a mass spectrometer coupled to a processing chamber via a beam-forming phase that includes a buffer chamber, a shutter chamber, and a quiescence chamber in accordance with an embodiment of the invention.

FIG. 3 illustrates a schematic cross-sectional view of an example processing system including a mass spectrometer coupled to a processing chamber via a beam-forming phase that includes a buffer chamber, a shutter chamber, and a quiescence chamber in accordance with an embodiment of the invention. The processing system of FIG. 3 may be a specific implementation of other processing systems described herein such as the processing system of FIG. 1, for example. Similarly labeled elements may be as previously described.

Referring to FIG. 3, a processing system 300 includes a processing chamber 330 fluidically coupled to a mass spectrometer 340 via a beam-forming phase 310. The beam-forming phase 310 is fluidically coupled to the processing chamber 330 via a first orifice 314 enabling a particle beam to enter a buffer chamber 311 of the beam-forming phase 310. A second orifice 315 provides fluidic coupling of a shutter chamber 312 of the beam-forming phase 310 to the buffer chamber 311. The buffer chamber 311 is evacuated using a first outward particle flow 327 generated at a first exhaust port 317.

A shutter 320 is included in the shutter chamber 312 and serves to block the path 324 of particle beam in the in the closed position and to permit the particle beam to reach an interface 344 of the mass spectrometer 340 (as well as an ionizer 346) along the path 325 in the open position. The shutter chamber 312 is evacuated using a second outward particle flow 328 generated at a second exhaust port 318.

The beam-forming phase 310 further includes a quiescence chamber 313 fluidically coupled to the shutter chamber 312 via third orifice 316. As before, the ionizer 346 may extend into the quiescence chamber 313 reducing the distance between the ionizer 346 and the third orifice 316. The quiescence chamber 313 is vented using a third outward particle flow 329 generated at a third exhaust port 319. In various embodiments, the diameter of the third orifice 316 is greater than the diameter of the second orifice 315 and is about double the size of the diameter of the second orifice 315 in one embodiment. For example, the diameter of the second orifice 315 may be about 35/1000 ths of an inch (~0.9 mm) while the diameter of the third orifice 316 may be about 59/1000 ths of an inch (~1.5 mm). As previously described, the diameter of the second orifice 315 may also be greater than the diameter of the first orifice 314.

Similar to the quiescence chamber 313, the buffer chamber 311 may serve to further enhance the signal-to-noise ratio at the mass spectrometer 340. The separate evacuation of the buffer chamber 311 causes the pressure in the shutter chamber 312 to be lower than the pressure in the buffer chamber 311. Consequently, the signal-to-noise ratio may advantageously be improved at the mass spectrometer 340. The inclusion of the buffer chamber 311 may advantageously expand the operational range of mass spectrometer 340 of the processing system 300 to include higher pressures in the processing chamber 330. In one embodiment, mass spectrometer 340 of the processing system 300 is configured to operate at pressures up to 1 Torr.

The multi-chamber configuration of the processing system 200 and the processing system 300 are specific examples of cascaded pressure-reduction chambers. Additional separately-evacuated chambers may be included when measurements are desired at higher processing chamber pressures. The shutter may be included in any of the cascaded pressure-reduction chambers.

In this specific case, the beam-forming phase 310 includes both a buffer chamber 311 and a quiescence chamber 313, but this does not have to be the case. For example, in applications where pressure reduction before the shutter chamber is desired, but no further pressure reduction before the mass spectrometer is required, the quiescence chamber may be omitted. Additionally, the shutter chamber may be extended and the shutter may be placed a suitable distance from the mass spectrometer. Other configurations not explicitly described will also be apparent to ones of skill in the art in view of the entirety of the disclosure.

As mentioned elsewhere, the processing systems described herein may advantageously have a small footprint. For example, a combined length 350 of the buffer chamber 311, the shutter chamber 312, and the quiescence chamber 313 may be advantageously small. In various embodiments the combined length 350 is between about 12 inches and 15 inches and is about 13 inches (~330 mm) in one embodiment.

The buffer chamber 311, the shutter chamber 312, and the quiescence chamber 313 may have advantageously small volumes. For example, one or more may be implemented using a radial port flange with an outer diameter less than about 3 inches (e.g. 2.75 inches). In various embodiments, the width 351 of the buffer chamber 311 may be between about 2 inches and about 4 inches and is about 3 inches (~76 mm) in one embodiment. The width 352 of the shutter chamber 312 may be similarly small, although not necessarily the same size.

The width 353 of the quiescence chamber 313 may also be small. In some applications it may be advantageous to include additional space between the third orifice 316 and the interface 344 of the mass spectrometer 340 (e.g. further decouple the effects of the shutter on measurement volatility). In these cases, the width 353 may be larger than the width 351 and the width 352. In various embodiments, the width 353 may be between about 2 inches and about 6 inches and is about 4 inches (~102 mm) in one embodiment.

Figure 4:
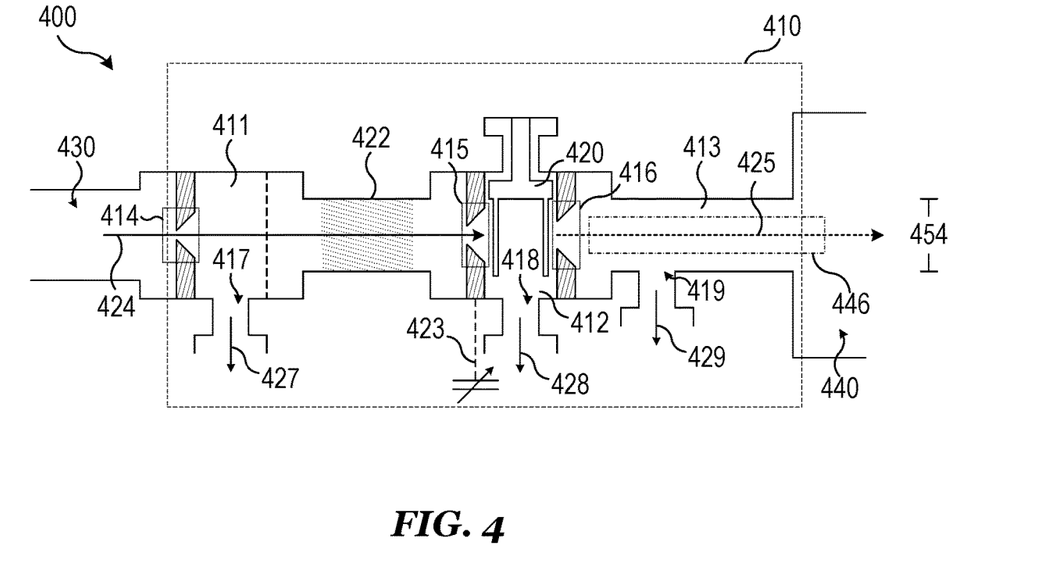
FIG. 4 illustrates a schematic cross-sectional view of another example processing system including a mass spectrometer coupled to a processing chamber via a beam-forming phase that includes a buffer chamber, a shutter chamber, and a quiescence chamber in accordance with an embodiment of the invention.

FIG. 4 illustrates a schematic cross-sectional view of another example processing system including a mass spectrometer coupled to a processing chamber via a beam-forming phase that includes a buffer chamber, a shutter chamber, and a quiescence chamber in accordance with an embodiment of the invention. The processing system of FIG. 4 may be a specific implementation of other processing systems described herein such as the processing system of FIG. 1, for example. Similarly labeled elements may be as previously described.

Referring to FIG. 4, a processing system 400 includes a processing chamber 430 fluidically coupled to a mass spectrometer 440 via a beam-forming phase 410. The beam-forming phase 410 includes a buffer chamber 411, a shutter chamber 412, and a quiescence chamber 413 fluidically coupled to the processing chamber 430 via a first orifice 414, a second orifice 415, and a third orifice 416, respectively. A shutter 420 serves to block the path 424 of particle beam in the in the closed position and to permit the particle beam to reach the mass spectrometer 440 (as well as an ionizer 446) along the path 425 in the open position.

As previously described, each chamber is separately evacuated using a first outward particle flow 427 at a first exhaust port 417, a second outward particle flow 428 at a second exhaust port 418, and a third outward particle flow 429 at a third exhaust port 419 so as to facilitate decreasing chamber pressure from the processing chamber 430 to the mass spectrometer 440.

While still advantageously keeping the volume of the quiescence chamber 413 small, an extension of the quiescence chamber 413 may be included to further separate the third orifice 416 from the mass spectrometer 440. For example, the diameter 454 of an extension of the quiescence chamber 413 may be small. In various embodiments, the diameter 454 is between about 1 inch and about 2 inches and is about 1.575 inches (~40 mm) in one embodiment.

The beam-forming phase 410 may also include an optional ceramic break 422. In one embodiment, the optional ceramic break 422 is included as part of the buffer chamber 411 between the first orifice 414 and the second orifice 415. The optional ceramic break 422 may be included to advantageously electrically isolate the processing chamber 430 (e.g. functioning as plasma shielding) from one or more portions of the beam-forming phase 410 (and the mass spectrometer 440). An optional electrical bias 423 may also be electrically coupled to one of more of orifice (illustrated here as being electrically coupled to the second orifice 415.

Figure 5:
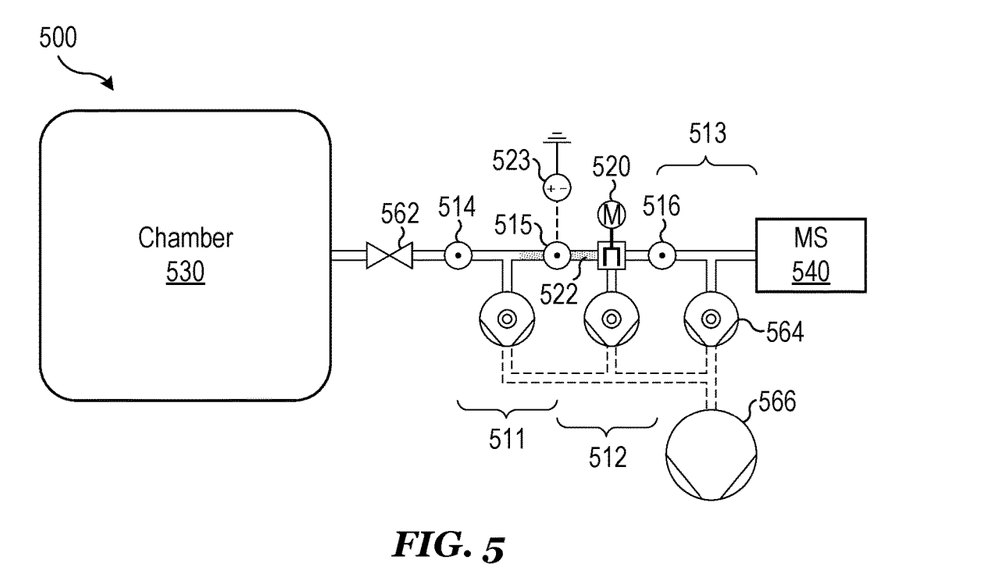
FIG. 5 illustrates a schematic layout of an example processing system including a mass spectrometer coupled to a processing chamber via a beam-forming phase that includes a buffer chamber, a shutter chamber, and a quiescence chamber in accordance with an embodiment of the invention.

FIG. 5 illustrates a schematic layout of an example processing system including a mass spectrometer coupled to a processing chamber via a beam-forming phase that includes a buffer chamber, a shutter chamber, and a quiescence chamber in accordance with an embodiment of the invention.

Referring to FIG. 5, a processing system 500 includes a processing chamber 530 fluidically coupled to a mass spectrometer 540 through a valve 562 (e.g. an electrically operated gate valve). The valve 562 allows particles from the processing chamber 530 to reach a first orifice 514 which forms a particle beam in a buffer chamber 511. The particle beam is further focused by a second orifice 515 as it passes into a shutter chamber 512.

Optionally, a ceramic break 522 may be included before and/or after the second orifice 515. As a further option, the second orifice 515 may be electrically biased (e.g. positively biased) using an optional electrical bias source 523 to focus ions in the particle beam and remove spurious electrons. As before, additional orifices and chambers may also be biased by optional electrical bias source 523 or additional electrical bias sources.

A shutter 520 is included in the shutter chamber 512. The shutter 520 may be a double-sided shutter configured to be rotated by an electric motor mechanically coupled to the shutter 520. The particle beam is further focused by passing through a third orifice 516 into a quiescence chamber 513. The mass spectrometer 540 is fluidically coupled to the quiescence chamber 513 and aligned with the particle beam.

The buffer chamber 511, the shutter chamber 512, and the quiescence chamber 513 are each separately evacuated using dedicated vacuum pumps 564 (e.g. a dedicated turbomolecular pumps). The optimal pumping speed of each of the dedicated vacuum pumps 564 is advantageously low due to the small volume and cascaded arrangement of the successive chambers. In various embodiments, the pumping speed of each of the dedicated vacuum pumps 564 is less than about 10 L/s and is about 60 L/s in one embodiment. However, the pumping speed may depend on chamber volume, orifice size, and other factors.

In some embodiments (e.g. when the processing chamber 530 operates at higher pressures), an optional roughing pump may be included to ensure that the dedicated vacuum pumps are able to operate. The pumping speed may be similar or different between dedicated vacuum pumps 564 and may depend on the specific details of a given application.

Figure 6:
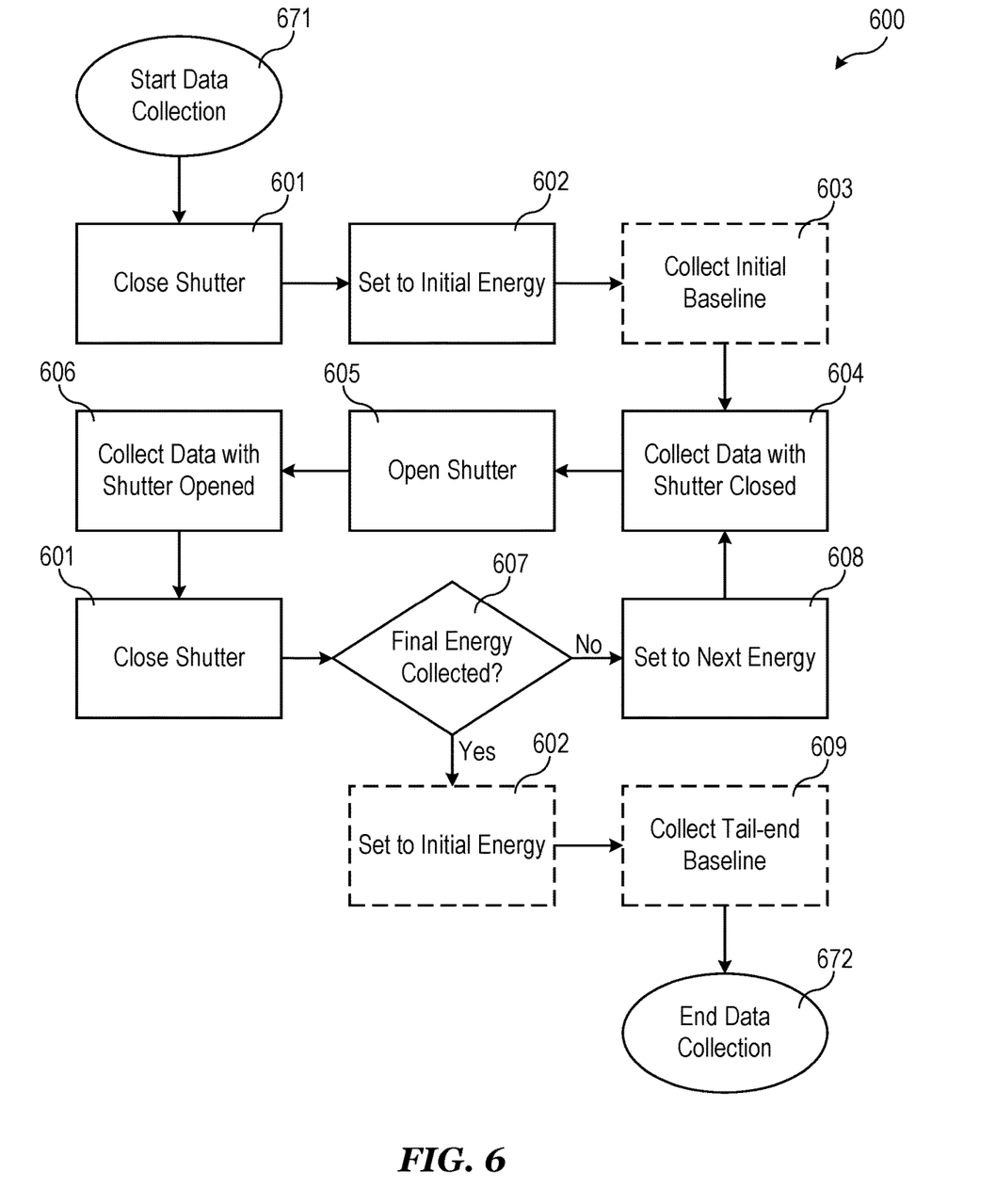
FIG. 6 illustrates a flowchart of an example method of collecting quantification data from a processing chamber using a shutter and an electron energy sweep in accordance with an embodiment of the invention.

FIG. 6 illustrates a flowchart of an example method of collecting quantification data from a processing chamber using a shutter and an electron energy sweep in accordance with an embodiment of the invention. The method of FIG. 6 may be combined with other methods and performed using the systems as described herein, such as the processing systems of FIGS. 1-5, for example. The method of FIG. 6 may be combined with any of the embodiments of FIGS. 7-9.

Referring to FIG. 6, a method 600 begins with an initial step 671 of starting data collection by a processing system. The processing system may include a controller coupled to a shutter and a mass spectrometer. The controller may be configured to initiate the method 600 by starting data collection in the processing system. The controller may include a processor and a non-transitory computer-readable medium storing a program including instructions that, when executed, perform the method 600. The controller may be implemented as an executable program stored in non-transitory computer-readable media of a general purpose computer. In other embodiments, the controller may be a dedicated controller capable of accepting parameter inputs from a user interface or external source such as a connected computer.

Step 601 of the method 600 is to close the shutter to block a particle beam from reaching the mass spectrometer. The electron energy of an ionizer of the mass spectrometer is then set to an initial energy value in step 602. Optionally, an initial baseline is then collected as a reference point for the data collection.

After the initial baseline is either collected or omitted, a series of steps are cyclically performed as an electron energy sweep. Data is collected with the shutter closed in step 604. The data collected in step 604 includes quantification data of the background because the shutter is closed. That is, the particle beam is blocked by the shutter and only particles that are not part of the coherent beam are able to reach the mass spectrometer.

After background quantification data is collected in step 604, the shutter is opened in step 605 and data is collected with the shutter opened in step 606. The data collected in step 606 includes quantification data of the particle beam (e.g. signal data) as well as data generated by the background. After collecting the signal quantification data, the shutter is again closed.

In step 607, the processing system checks to see if the electron energy is equal to a predetermined final value. If not, the electron energy is set to the next energy step in step 608 and the loop resumes with again collecting background data in step 604. In this way the cyclic data collection process steps through a range of electron energies starting at an initial energy value and executing a data collection loop for each of a plurality of energy steps.

If, in step 607, the processing system determines that the electron energy is equal to the final energy, the loop is exited and the energy is optionally set back to the initial energy value so that a tail-end baseline may be optionally collected in step 609. Data collection is then ended in step 672. In cases where the tail-end baseline is not collected, the method 600 may proceed directly from step 607 to step 672 upon determining that data has been collected for the final energy value. Collecting a tail-end baseline (i.e. after data collection) may be beneficial when measuring high density gas/plasma from the processing chamber to correct for baseline shift due to charging in the mass spectrometer during continuous use, and to verify processing chamber stability throughout the data collection process.

The duration of the data collection steps (step 604 and step 606) may be advantageously short. In various embodiments, the duration is less than about 30 s and is less than about 10 s in some embodiments. For example, the duration may be between about 0.1 s and about 50 s. In one embodiment, the duration is about 10 s.

The method 600 including the electron energy sweep may advantageously be performed automatically. The background and baseline data may be automatically used to limit misdiagnosis of the system due to contamination or drift. Qualitative and quantitative analysis of the data may also be performed automatically. In this way the necessary knowledge and effort of process engineers to obtain diagnostic information is advantageously reduced. Automated diagnostics may carry the additional benefit of reducing human error as well. Further, multiple electron energy scans may be batch processed resulting in a comprehensive diagnostic report for a given process.

FIG. 7 illustrates two graphs qualitatively demonstrating an example method of measuring quantities of species in a processing chamber by collecting quantification data from a processing chamber using a shutter and an electron energy sweep in accordance with an embodiment of the invention. The method of FIG. 7 may be combined with other methods and performed using the systems as described herein, such as the processing systems of FIGS. 1-5, for example. The method of FIG. 7 may be combined with any of the embodiments of FIGS. 6, 8, and 9.

Referring to FIG. 7, a graph 701 qualitatively shows data points of a signal 781 measured by a mass spectrometer of a processing system during data collection (e.g. collecting data as described in method 600 of FIG. 6) The signal 781 includes both background quantification data and signal quantification data. The source of the signal quantification data is a particle beam originating from a processing chamber of the processing system but also includes the background signal from particles originating not from the processing chamber but from the mass spectrometer itself.

As previously described, data collection steps are performed in an alternating fashion as the electron energy of an ionizer in the mass spectrometer is incremented through a plurality of energy steps from an initial energy value to a final energy value. As shown, a series of data points 784 corresponding to background signal quantification data is collected during each step 704 while a shutter of the processing system remains closed. Similarly, a series of data points 786 corresponding to signal quantification data is collected during each step 706 during while the shutter remains open.

The many series of data points from the electron energy sweep are processed to generate a data set 782 as shown in qualitative graph 702. For example, each of the series of data points 784 may be averaged to obtain average background data points that may be subtracted from corresponding average signal data points obtained by averaging each of the series of data points 786. In this way, accuracy of the data set 782 may advantageously be increased by subtracting out temporally localized background data for each signal data point to account for transient background effects in the mass spectrometer.

During the data collection used to generate the data set 782 an electromagnetic filter (e.g. a quadrupole analyzer of an RGA) is tuned to a particular mass/charge ratio (e.g. a specific mass value when the detected species all have +1 charge). Therefore, each of the data points in the data set 782 represent particle signals that have the same m/z. The filtered mass may also be swept during data collection. For example, the filtered mass may be stepped from an initial mass value to a final mass value for each of the energy steps (e.g. when comparative results are prioritized) or the filtered mass may remain constant for an entire electron energy sweep and then may be by stepped to a new filtered mass value for a new electron energy sweep (e.g. when currency of results is prioritized).

The data set 782 may be used to detect several varieties of a species at the mass spectrometer. For example, once the electron energy reaches a threshold ionization energy 794 of a species (e.g. 11.62 eV for $C_2H+e^- \rightarrow C_2H^+ + 2e^-$), ionized species (e.g. $C_2H^+$) are detected by the mass spectrometer (tuned to m/z=25). Therefore, a first interval 791 beginning at the threshold ionization energy 794 can be used to determine quantifying information about the species ($C_2H$ in this specific example). For example, the data points in the first interval 791 may be compared to a theoretical ionization curve 796 (shown here as a linear curve for simplicity, but may also be any curve, including empirically derived curves). The species detected in the first interval 791 is then a first variety of the species in the particle beam originating from the processing chamber which was then ionized in the mass spectrometer (e.g. an ionized species).

Using this technique, other varieties of the species may also be detected. Specifically, once the electron energy reaches a threshold dissociation energy 795 of the species (e.g. 17.22 eV for $C_2H_2+e^- \rightarrow C_2H^+ + H + 2e^-$), dissociated (and ionized) species (e.g. $C_2H^+$) are detected by the mass spectrometer, (e.g. using an inflection point in the plot of signal versus electron energy). The dissociative ionization energy may be approximately equal to the threshold ionization energy 794 plus the energy needed to break a bond to dissociate an uncracked species (e.g. $C_2H_2$ here).

Therefore, the data points in a second interval 792 beginning at the threshold dissociation energy 795 can be used to determine quantifying information about the species ($C_2H$ in this specific example). As above, the data points in the second interval 792 may be compared to a theoretical dissociation curve 797 to detect a second variety of the species originating in the mass spectrometer itself (e.g. background particles since the second variety was cracked in the mass spectrometer; dissociated species). Thus, species originating in the processing chamber may be advantageously distinguished from species originating in the mass spectrometer.

A third variety of the species may be detected in a similar manner for energies below the threshold ionization energy 794 in a third interval 793. For example the species may also exist in the processing chamber as a metastable particle (e.g. in an excited state). Due to the elevated energy level of one or more electrons of the metastable particle, the threshold metastable ionization energy is lowered compared to the threshold ionization energy 794 (e.g. <11.62 eV for $C_2H^*$+ $e^- \rightarrow C_2H^+ + 2e^-$ to continue the above example. Therefore, the metastable variety of the species is advantageously distinguishable in the third interval 793. In contrast, processing systems that include conventionally implemented mass spectrometers are unable to distinguish metastable varieties. As described for the other varieties, the data points in the third interval 793 may be compared to a theoretical metastable curve 798 to detect a third variety of the species that are metastable particles in an excited state and originate in the processing chamber.

As seen in the qualitative graph 702, signals from previous intervals may overlap with signals of other species in later intervals. These contributions may be adjusted for (e.g. using extrapolation and or theoretical techniques). Additionally, although the above examples focused on detecting varieties of a neutral species, ions may also be detected (but will have z>1). In some cases ions originating from the processing chamber are intentionally removed (e.g. using a ceramic break and/or an electrical bias).

FIG. 8 illustrates an example method of measuring quantities of species present in a processing chamber using collected quantification data in accordance with an embodiment of the invention. The method of FIG. 8 may be combined with other methods and performed using the systems as described herein, such as the processing systems of FIGS. 1-5, for example. The method of FIG. 8 may be combined with any of the embodiments of FIGS. 6, 7, and 9. Although shown in a logical order, the arrangement and numbering of the steps of FIG. 8 are not intended to be limiting. Various steps in the method of FIG. 8 may be performed in any suitable order or concurrently with one another as may be apparent to a person of skill in the art.

Referring to FIG. 8, step 801 of a method 800 of measuring quantities of species present in a processing chamber includes closing a shutter positioned between the processing chamber and a mass spectrometer to block a particle beam originating from the processing chamber. The mass spectrometer includes an ionizer. Step 802 is to set an electron energy of the ionizer to an initial energy value.

Step 803 includes sweeping the electron energy from the initial energy value to a final energy value by repeatedly (i.e. cyclically) collecting background quantification data while the shutter is closed, opening the shutter, collecting signal quantification data of species in the particle beam while the shutter is open, closing the shutter, and setting the electron energy to a next value.

After collecting signal quantification data with the electron energy set at the final energy value, step 804 is to determine quantities of species in the processing chamber using the signal quantification data and the background quantification data.

FIG. 9 illustrates an example method measuring quantities of species present in a processing chamber using an electron energy sweep in accordance with an embodiment of the invention. The method of FIG. 9 may be combined with other methods and performed using the systems as described herein, such as the processing systems of FIGS. 1-5, for example. The method of FIG. 9 may be combined with any of the embodiments of FIGS. 6-8. Although shown in a logical order, the arrangement and numbering of the steps of FIG. 9 are not intended to be limiting. Various steps in the method of FIG. 9 may be performed in any suitable order or concurrently with one another as may be apparent to a person of skill in the art.

Referring to FIG. 9, step 901 of a method 900 of measuring quantities of species present in a processing chamber includes sweeping an electron energy of an ionizer of a mass spectrometer through a plurality of energy steps beginning at an initial energy value and ending with a final energy value. A data set is generated by collecting a series of data points corresponding to detection events of the species at each of the plurality of energy steps in step 902. The species comprises a mass/charge ratio selected by the mass spectrometer.

Step 903 is to determine the quantity of a first variety of the species present in the processing chamber using a first interval of the data set beginning at a threshold ionization energy of the first variety. The first variety also has the mass/charge ratio. That is, the various varieties of the species all have the same mass/charge ratio.

Example embodiments of the invention are summarized here. Other embodiments can also be understood from the entirety of the specification as well as the claims filed herein.

EXAMPLE 1

A plasma processing system including: a plasma chamber configured to contain a plasma; a shutter chamber fluidically coupled to the plasma chamber via a first orifice, the first orifice being configured to generate a particle beam from the plasma using a pressure differential between the shutter chamber and the plasma chamber; a mass spectrometer fluidically coupled to the shutter chamber, the mass spectrometer including an ionizer configured to ionize species of the particle beam by sweeping through a range of electron energies in a plurality of energy steps; and a shutter disposed in the shutter chamber between the first orifice and the mass spectrometer in the path of the particle beam, the shutter being configured to open and close during each of the plurality of energy steps.

EXAMPLE 2

The plasma processing system of example 1, further including: a quiescence chamber disposed between the shutter chamber and the mass spectrometer, the quiescence chamber being fluidically coupled to the shutter chamber via a second orifice in the path of the particle beam; a first vacuum pump fluidically coupled to the shutter chamber; and a second vacuum pump fluidically coupled to the quiescence chamber.

EXAMPLE 3

The plasma processing system of example 2, further including: a buffer chamber disposed between the plasma chamber and the shutter chamber, the buffer chamber being fluidically coupled to the plasma chamber via a third orifice; a third vacuum pump fluidically coupled to the buffer chamber; and where the diameter of the third orifice is less than the diameter of the first orifice that is less than the diameter of the second orifice.

EXAMPLE 4

The plasma processing system of example 3, where both the shutter chamber and the buffer chamber are radial port flanges including outer diameters less than about three inches.

EXAMPLE 5

The plasma processing system of example 3, where the combined length of the buffer chamber, the shutter chamber, and the quiescence chamber along a direction parallel to the path of the particle beam is less than fifteen inches.

EXAMPLE 6

The plasma processing system of one of examples 1 to 5, further including: a ceramic break disposed between the plasma chamber and the first orifice.

EXAMPLE 7

The plasma processing system of example 6, further including: an electrical bias source electrically coupled to the first orifice.

EXAMPLE 8

The plasma processing system of one of examples 1 to 7, where the shutter is a double-sided shutter configured to be rotated by an electrical motor mechanically coupled thereto.

EXAMPLE 9

The plasma processing system of one of examples 1 to 8, where the shutter chamber is a radial port flange including an outer diameter less than about three inches.

EXAMPLE 10

The plasma processing system of one of examples 1 to 9, where the path of the particle beam is a straight line from the plasma chamber to the mass spectrometer.

EXAMPLE 11

The plasma processing system of one of examples 1 to 10, where the mass spectrometer is a residual gas analyzer (RGA) mass spectrometer.

EXAMPLE 12

A method of measuring quantities of species in a processing chamber, the method including: closing a shutter positioned between the processing chamber and a mass spectrometer to block a particle beam originating from the processing chamber, the mass spectrometer including an ionizer; setting an electron energy of the ionizer to an initial energy value; sweeping the electron energy from the initial energy value to a final energy value by cyclically performing the following steps collecting background quantification data while the shutter is closed, opening the shutter, collecting signal quantification data of species in the particle beam while the shutter is open, closing the shutter, and setting the electron energy to a next value; and after collecting signal quantification data with the electron energy set at the final energy value, determining quantities of species in the processing chamber using the signal quantification data and the background quantification data.

EXAMPLE 13

The method of example 12, further including: after setting the electron energy to the initial energy value and before sweeping the electron energy, collecting initial baseline quantification data; and where determining the quantities of species in the processing chamber further includes using the initial baseline quantification data.

EXAMPLE 14

The method of example 13, further including, after collecting the signal quantification data with the electron energy set at the final energy value and before determining the quantities of species in the processing chamber: setting the electron energy to the initial energy value; collecting tail-end baseline quantification data; and where determining the quantities of species in the processing chamber further includes using the tail-end baseline quantification data.

EXAMPLE 15

The method of one of examples 12 to 14, where each quantification data collection step while sweeping the electron energy is less than about ten seconds in duration.

EXAMPLE 16

The method of one of examples 12 to 15, further including: sweeping a filtered mass of the mass spectrometer from an initial mass value to a final mass value.

EXAMPLE 17

A method of measuring quantities of a species present in a processing chamber, the method including: sweeping an electron energy of an ionizer of a mass spectrometer through a plurality of energy steps beginning at an initial energy value and ending with a final energy value; generating a data set by collecting a series of data points corresponding to detection events of the species at each of the plurality of energy steps, the species including a mass/charge ratio selected by the mass spectrometer; and determining the quantity of a first variety of the species present in the processing chamber using a first interval of the data set beginning at a threshold ionization energy of the first variety, the first variety having the mass/charge ratio.

EXAMPLE 18

The method of example 17, where, for each of the plurality of energy steps, generating the data set includes: closing a shutter positioned between the processing chamber and the mass spectrometer to block a particle beam originating from the processing chamber; collecting a series of background data points while the shutter is closed; opening the shutter to allow the particle beam to reach the mass spectrometer; collecting a series of signal data points while the shutter is open; and subtracting the average of the series of background data points from the average of the series of signal data points.

EXAMPLE 19

The method of one of examples 17 and 18, further including: determining the quantity of a second variety of the species present in the processing chamber using a second interval of the data set beginning at a threshold dissociation energy of the second variety, the second variety having the mass/charge ratio.

EXAMPLE 20

The method of one of examples 17 to 19, further including: determining the quantity of a second variety of the species present in the processing chamber using a second interval of the data set ending at the ionization energy of the first variety, the second variety having the mass/charge ratio; where the first variety of the species is a stable particle from plasma in the processing chamber; and where the second variety of the species is a metastable particle in an excited state of the stable particle from the plasma.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A plasma processing system comprising:
   a plasma chamber configured to contain a plasma;
   a shutter chamber fluidically coupled to the plasma chamber via a first orifice, the first orifice being configured to generate a particle beam from the plasma using a pressure differential between the shutter chamber and the plasma chamber;
   a mass spectrometer fluidically coupled to the shutter chamber, the mass spectrometer comprising an ionizer configured to ionize species of the particle beam by sweeping through a range of electron energies in a plurality of energy steps; and
   a shutter disposed in the shutter chamber between the first orifice and the mass spectrometer in the path of the particle beam, the shutter being configured to open and close during each of the plurality of energy steps.

2. The plasma processing system of claim 1, further comprising:
   a quiescence chamber disposed between the shutter chamber and the mass spectrometer, the quiescence chamber being fluidically coupled to the shutter chamber via a second orifice in the path of the particle beam;
   a first vacuum pump fluidically coupled to the shutter chamber; and
   a second vacuum pump fluidically coupled to the quiescence chamber.

3. The plasma processing system of claim 2, further comprising:
   a buffer chamber disposed between the plasma chamber and the shutter chamber, the buffer chamber being fluidically coupled to the plasma chamber via a third orifice;
   a third vacuum pump fluidically coupled to the buffer chamber; and
   wherein the diameter of the third orifice is less than the diameter of the first orifice that is less than the diameter of the second orifice.

4. The plasma processing system of claim 3, wherein both the shutter chamber and the buffer chamber are radial port flanges comprising outer diameters less than about three inches.

5. The plasma processing system of claim 3, wherein the combined length of the buffer chamber, the shutter chamber, and the quiescence chamber along a direction parallel to the path of the particle beam is less than fifteen inches.

6. The plasma processing system of claim 1, further comprising:
   a ceramic break disposed between the plasma chamber and the first orifice.

7. The plasma processing system of claim 6, further comprising:
   an electrical bias source electrically coupled to the first orifice.

8. The plasma processing system of claim 1, wherein the shutter is a double-sided shutter configured to be rotated by an electrical motor mechanically coupled thereto.

9. The plasma processing system of claim 1, wherein the shutter chamber is a radial port flange comprising an outer diameter less than about three inches.

10. The plasma processing system of claim 1, wherein the path of the particle beam is a straight line from the plasma chamber to the mass spectrometer.

11. The plasma processing system of claim 1, wherein the mass spectrometer is a residual gas analyzer (RGA) mass spectrometer.

12. A method of measuring quantities of species in a processing chamber, the method comprising:
   closing a shutter positioned between the processing chamber and a mass spectrometer to block a particle beam originating from the processing chamber, the mass spectrometer comprising an ionizer;
   setting an electron energy of the ionizer to an initial energy value;
   sweeping the electron energy from the initial energy value to a final energy value by cyclically performing the following steps
      collecting background quantification data while the shutter is closed,
      opening the shutter,
      collecting signal quantification data of species in the particle beam while the shutter is open,
      closing the shutter, and
      setting the electron energy to a next value; and
   after collecting signal quantification data with the electron energy set at the final energy value, determining quantities of species in the processing chamber using the signal quantification data and the background quantification data.

13. The method of claim 12, further comprising:
after setting the electron energy to the initial energy value and before sweeping the electron energy, collecting initial baseline quantification data; and
wherein determining the quantities of species in the processing chamber further comprises using the initial baseline quantification data.

14. The method of claim 13, further comprising, after collecting the signal quantification data with the electron energy set at the final energy value and before determining the quantities of species in the processing chamber:
setting the electron energy to the initial energy value;
collecting tail-end baseline quantification data; and
wherein determining the quantities of species in the processing chamber further comprises using the tail-end baseline quantification data.

15. The method of claim 12, wherein each quantification data collection step while sweeping the electron energy is less than about ten seconds in duration.

16. The method of claim 12, further comprising:
sweeping a filtered mass of the mass spectrometer from an initial mass value to a final mass value.

17. A method of measuring quantities of a species present in a processing chamber, the method comprising:
sweeping an electron energy of an ionizer of a mass spectrometer through a plurality of energy steps beginning at an initial energy value and ending with a final energy value;
generating a data set by collecting a series of data points corresponding to detection events of the species at each of the plurality of energy steps, the species comprising a mass/charge ratio selected by the mass spectrometer;
determining the quantity of a first variety of the species present in the processing chamber using a first interval of the data set beginning at a threshold ionization energy of the first variety, the first variety having the mass/charge ratio; and
determining the quantity of a second variety of the species present in the processing chamber using a second interval of the data set, the second variety having the mass/charge ratio.

18. The method of claim 17, wherein, for each of the plurality of energy steps, generating the data set comprises:
closing a shutter positioned between the processing chamber and the mass spectrometer to block a particle beam originating from the processing chamber;
collecting a series of background data points while the shutter is closed;
opening the shutter to allow the particle beam to reach the mass spectrometer;
collecting a series of signal data points while the shutter is open; and
subtracting the average of the series of background data points from the average of the series of signal data points.

19. The method of claim 17, wherein the second interval of the data set begins at a threshold dissociation energy of the second variety.

20. The method of claim 17, wherein:
the second interval of the data set ends at the threshold ionization energy of the first variety;
wherein the first variety of the species is a stable particle from plasma in the processing chamber; and
wherein the second variety of the species is a metastable particle in an excited state of the stable particle from the plasma.

* * * * *